(12) United States Patent
Umehara et al.

(10) Patent No.: US 12,092,821 B2
(45) Date of Patent: Sep. 17, 2024

(54) OPTICAL COMPONENT, IMAGE DISPLAY DEVICE USING SAME, AND HEAD-UP DISPLAY

(71) Applicant: KYOCERA Corporation, Kyoto (JP)

(72) Inventors: Motohiro Umehara, Yasu (JP); Satoru Tsubokura, Omihachiman (JP); Mitsuhiro Kajihara, Higashiomi (JP); Yoshinori Kubo, Omihachiman (JP)

(73) Assignee: KYOCERA CORPORATION, Kyoto (JP)

( * ) Notice: Subject to any disclaimer, the term of this patent is extended or adjusted under 35 U.S.C. 154(b) by 619 days.

(21) Appl. No.: 17/430,294

(22) PCT Filed: Jan. 24, 2020

(86) PCT No.: PCT/JP2020/002600
§ 371 (c)(1),
(2) Date: Aug. 11, 2021

(87) PCT Pub. No.: WO2020/166306
PCT Pub. Date: Aug. 20, 2020

(65) Prior Publication Data
US 2022/0137407 A1 May 5, 2022

(30) Foreign Application Priority Data

Feb. 13, 2019 (JP) .................. 2019-023374

(51) Int. Cl.
*B32B 15/04* (2006.01)
*B32B 17/06* (2006.01)
*G02B 27/01* (2006.01)
*H05K 7/20* (2006.01)

(52) U.S. Cl.
CPC ..... *G02B 27/0149* (2013.01); *H05K 7/20972* (2013.01)

(58) Field of Classification Search
CPC .................. G02B 27/0149; H05K 7/20972
USPC .................................. 428/701, 702
See application file for complete search history.

(56) References Cited

U.S. PATENT DOCUMENTS

| | | | | |
|---|---|---|---|---|
| 10,942,350 | B2 * | 3/2021 | Kubo | G02B 5/3066 |
| 11,125,999 | B2 * | 9/2021 | Kubo | G02B 1/02 |
| 2005/0083489 | A1 * | 4/2005 | Suzuki | H04N 9/3144 |
| | | | | 348/E9.027 |
| 2019/0196203 | A1 * | 6/2019 | Kubo | G02B 27/0172 |

(Continued)

FOREIGN PATENT DOCUMENTS

| | | |
|---|---|---|
| JP | H11-337919 A | 12/1999 |
| JP | 2005-114994 A | 4/2005 |

(Continued)

*Primary Examiner* — Lauren R Colgan
(74) *Attorney, Agent, or Firm* — Procopio, Cory, Hargreaves & Savitch LLP

(57) ABSTRACT

An optical component according to the present disclosure includes a substrate containing sapphire. The substrate is provided with a functional portion and a heat dissipating portion. An inclination of a main face of the substrate is 75° or greater with respect to a c-plane of the sapphire. The functional portion and the heat dissipating portion are provided so that an angle formed by a c-axis of the sapphire and a line segment connecting the functional portion and the heat dissipating portion is 15° or less.

15 Claims, 5 Drawing Sheets

(56) References Cited

U.S. PATENT DOCUMENTS

2019/0324269 A1* 10/2019 Kubo ................ G03B 21/14
2020/0012100 A1* 1/2020 Kubo ................ G02B 27/01

FOREIGN PATENT DOCUMENTS

| JP | 2005-121900 A | 5/2005 |
| JP | 2008-151903 A | 7/2008 |
| JP | 2017-223869 A | 12/2017 |
| WO | 2018/159598 A1 | 9/2018 |

* cited by examiner

OPTICAL COMPONENT, IMAGE DISPLAY DEVICE USING SAME, AND HEAD-UP DISPLAY

TECHNICAL FIELD

The present invention relates to an optical component used in an optical device such as an image display device, an image display device using the optical component, and a head-up display.

BACKGROUND ART

An image display device, such as a projector device (a PJ device) and a head-up display device (a HUD device), is a device that uses a light source and various optical elements to irradiate a wall, a screen, a window, or the like with image information displayed on an image forming unit such as a liquid crystal panel, and causes a user to visually recognize the image information. Various optical components are provided in such an image display device. Examples of the optical components include a lens, a fluorescent plate on which a phosphor is disposed, a polarizing plate, and a sealing glass that seals liquid crystals.

Patent Document 1 describes a HUD device that is for use in a vehicle and that is provided with a display element including liquid crystal cells between an incidence-side polarizing member and an emission-side polarizing member, and a light source that irradiates the display element with light. The HUD device projects and displays, on a display member provided within a front visual field of a driver, a display image that has been transmitted through the display element. The HUD device that is for use in a vehicle and that is described in Patent Document 1 is provided with a heat transfer member (a quartz heat dissipating plate) that is disposed on an optical path of the display image, between the liquid crystal cell and the display member, transmits the display image, and is in contact with the emission-side polarizing member, and is provided with a holding member that is formed from a metal material and holds the heat transfer member.

CITATION LIST

Patent Document

Patent Document 1: JP 2005-313733 A

SUMMARY

An optical component according to the present disclosure includes a substrate containing sapphire. The substrate is provided with a functional portion and a heat dissipating portion. An inclination of a main face of the substrate is 75° or greater with respect to a c-plane of the sapphire. The functional portion and the heat dissipating portion are provided so that an angle formed by a c-axis of the sapphire and a line segment connecting the functional portion and the heat dissipating portion is 15° or less.

An image display device according to the present disclosure includes a light source, and the above-described optical component positioned on an optical path of light emitted from the light source. Furthermore, a head-up display according to the present disclosure includes this image display device, and a display unit on which an image is displayed.

BRIEF DESCRIPTION OF DRAWINGS

FIG. 4 is an explanatory diagram illustrating a case in which the optical component according to the embodiment of the present disclosure is a polarizing plate, in which FIG. 4(A) illustrates a plan view and FIG. 4(B) illustrates a side view.

FIG. 5 is an explanatory diagram illustrating a case in which an optical component according to another embodiment of the present disclosure is a polarizing plate, in which FIG. 5(A) illustrates a plan view and FIG. 5(B) illustrates a cross-sectional view.

DESCRIPTION OF EMBODIMENTS

An optical component used in an image display device such as a HUD device is required to have improved heat transfer and heat dissipation to the outside. In recent years, such a requirement has been getting stronger in image display devices in which the density and resolution of displayed images have been increasing. In the present specification, "optical component" refers to a component having a function of controlling the intensity, color (wavelength), phase, polarization, or direction of light that is incident on the component. Examples of such an optical component include a fluorescent plate, a wavelength filter, a wave plate, a polarizing plate, a mirror, and a lens.

In the optical component of the present disclosure, an inclination of main faces of a substrate is 75° or greater with respect to a c-plane of sapphire, and the main faces of the substrate are substantially parallel to a c-axis direction of sapphire. The maximum inclination of the main faces is 90°, and in the case of 90°, the main faces of the substrate are parallel to the c-axis. The sapphire has a high thermal conductivity in a direction parallel to the c-axis, which is advantageous for heat transfer in a surface direction of the substrate. Furthermore, by providing a heat dissipating portion on at least one of the main faces, heat dissipation can be efficiently performed in the surface direction of the substrate, which is the direction in which the thermal conductivity is high.

Figure 1:
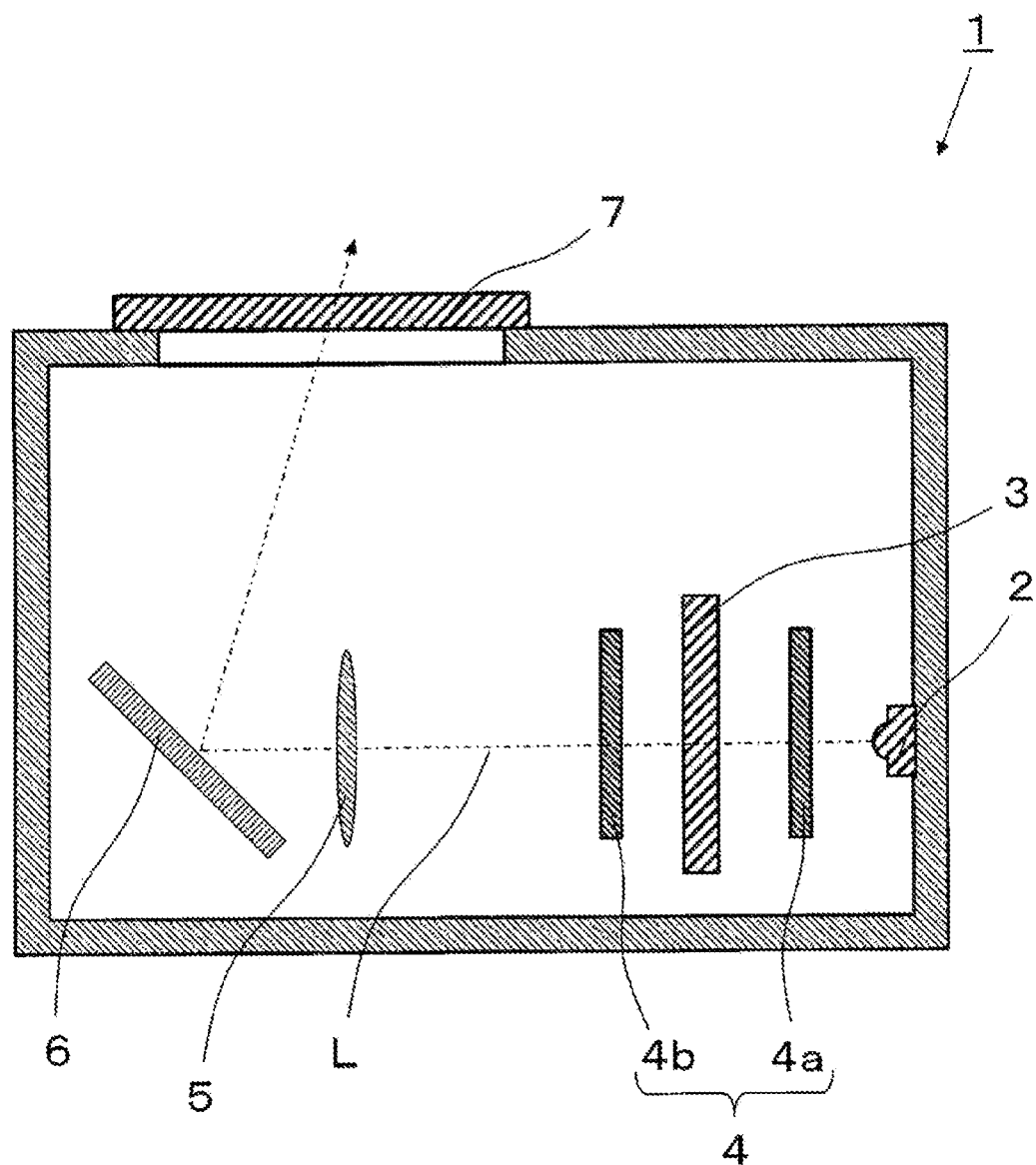
FIG. 1 is a schematic diagram illustrating an image display device that uses an optical component according to an embodiment of the present disclosure.

An optical component according to an embodiment of the present disclosure will be described with reference to FIGS. 1 to 4. FIG. 1 illustrates an image display device (HUD device) 1 provided with the optical component according to the embodiment of the present disclosure. The image display device 1 illustrated in FIG. 1 includes a light source 2, an image forming unit 3, a polarizing plate 4, a lens 5, a mirror 6, and an emission window 7. Of the members forming the image display device 1, the polarizing plate 4 and the lens 5 correspond to the optical component according to the embodiment of the present disclosure. Details of the image display device (HUD device) 1 will be described later.

Figure 2:
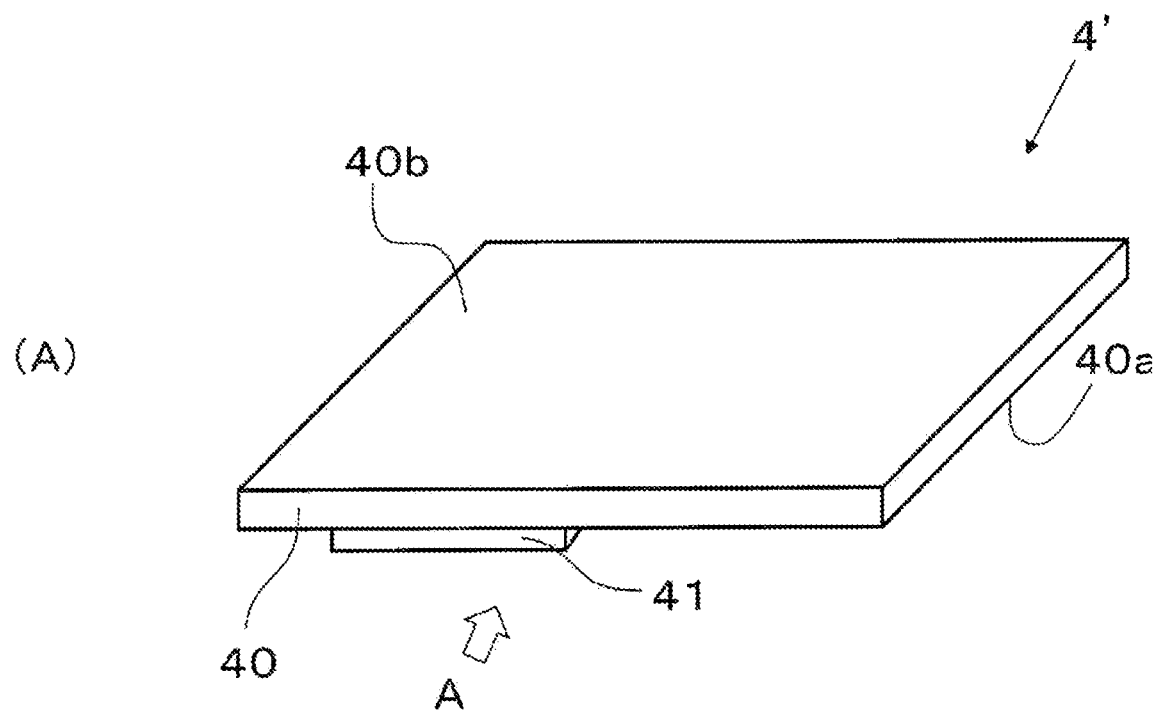
FIG. 2(A) is an explanatory diagram for describing the optical component according to the embodiment of the present disclosure.
FIG. 2(B) is an explanatory diagram of the optical component according to the embodiment of the present disclosure as viewed from a direction of an arrow A illustrated in FIG. 2(A).
Figure 2:
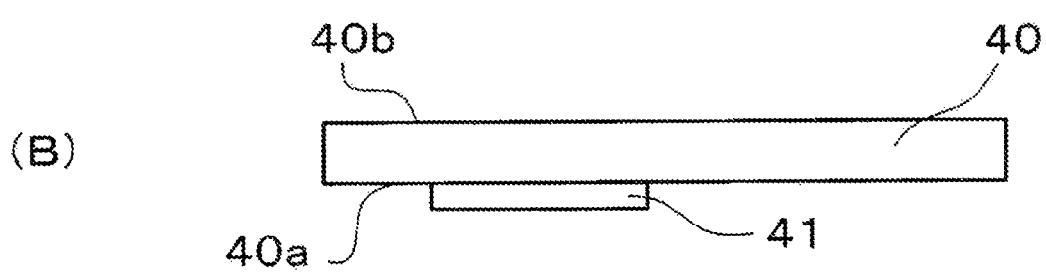

An optical component 4' according to the embodiment contains sapphire, and, as illustrated in FIG. 2, is provided with a substrate 40 including main faces on opposite sides from each other. For convenience, one of the main faces on opposite sides from each other may be referred to as a first main face 40a, and the other as a second main face 40b. Examples of the substrate 40 containing the sapphire include a sapphire substrate. Sapphire is a single crystal of aluminum oxide ($Al_2O_3$). Sapphire has excellent thermal resistance, thermal conductivity, and heat dissipation, and also has properties that can suppress an increase in temperature. The thickness of the substrate 40 is not limited. In order to satisfy mechanical strength and heat dissipation in a balanced manner, the substrate 40 may have a thickness from approximately 0.1 mm to approximately 15 mm.

Figure 3:
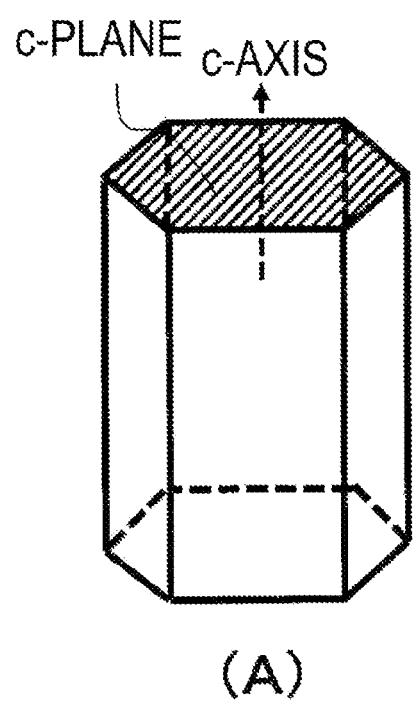
FIG. 3 is an explanatory diagram illustrating a crystalline structure of sapphire.
Figure 3:
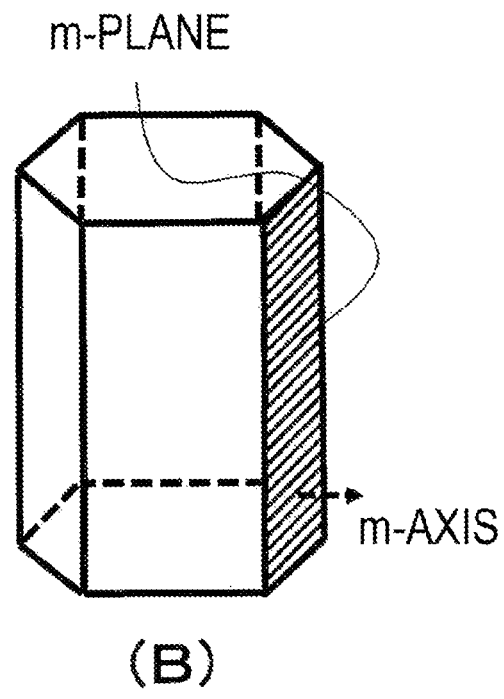
Figure 3:
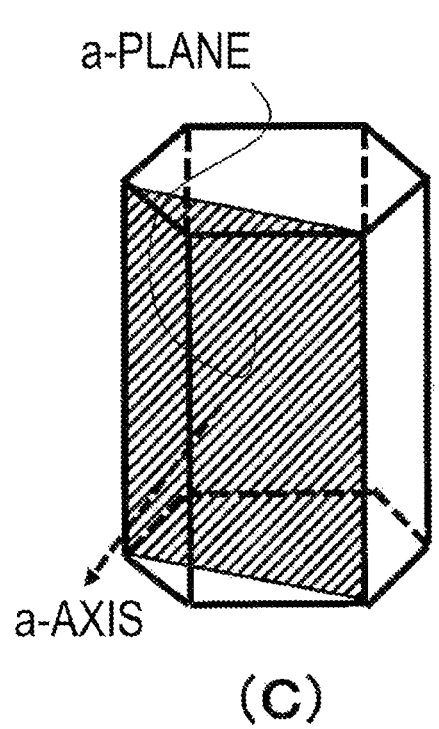
Figure 3:
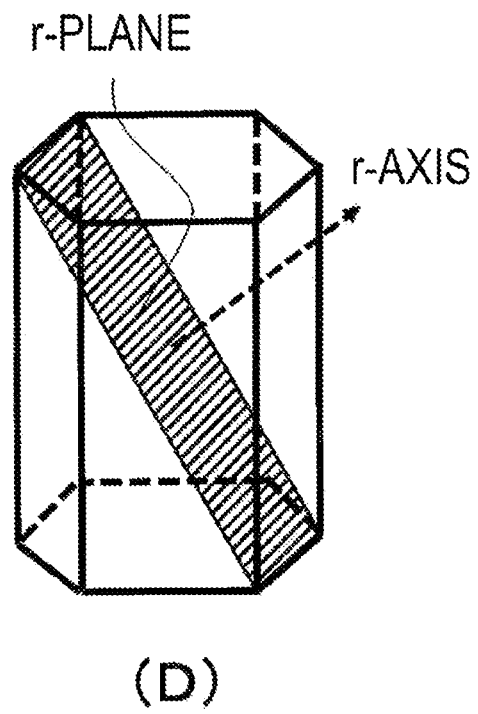

In the substrate 40, the inclination of the main faces is 75° or greater with respect to the c-plane of the sapphire. Here, crystal planes of the sapphire are described. FIG. 3 illustrates the crystalline structure of the sapphire. As illustrated in FIGS. 3(A) to (D), the sapphire has a hexagonal crystalline structure, and c-, m-, a-, and r-planes are present as representative crystal planes. Axes perpendicular to these planes are referred to as a c-axis, an m-axis, an a-axis, and an r-axis, respectively.

"The inclination of the main faces is 75° or greater with respect to the c-plane of the sapphire" indicates that, for example, when obtaining the substrate 40 by machining a sapphire ingot, the main faces (the first main face 40a and the second main face 40b) of the substrate 40 are substantially parallel to the c-axis illustrated in FIG. 3(A). In other words, the main faces of the substrate 40 need not necessarily be machined to be parallel to the c-axis illustrated in FIG. 3(A), and surfaces for which an angle formed with the c-plane of the sapphire is 75° or greater may be the main faces of the substrate 40. In the substrate 40, the inclination of the main faces may be 85° or greater with respect to the c-plane of the sapphire. When the main faces are curved surfaces, in a cross-sectional view in the thickness direction of the substrate 40, an angle formed between a plane approximated to the curved surfaces and the c-plane may be 75° or greater. The approximate plane is, for example, a least squares plane that is determined by the least squares method.

As illustrated in FIG. 2, in the optical component 4' according to the embodiment, a heat dissipating portion 41 is provided on the first main face 40a of the substrate 40. In the HUD device 1 or the like provided with the optical component 4', the heat dissipating portion 41 is used to efficiently dissipate heat generated when the device 1 is operated, heat received from outside of the device 1, and the like. The thermal conductivity of the sapphire is higher in a direction parallel to the c-axis than a direction orthogonal to the c-axis. Thus, heat is easily transferred in the c-axis direction (the surface direction of the substrate 40), and is dissipated through the heat dissipating portion 41 provided on the first main face 40a.

An aspect of the heat dissipating portion 41 is not particularly limited. A portion having a smaller heat resistance than a portion of the substrate 40 other than the heat dissipating portion 41, or a portion in which heat dissipation is promoted as a result of being cooled by an external cooling mechanism is referred to as a "heat dissipating portion". For example, the "heat dissipating portion" is a portion in which the surface area per unit projection area is larger, the surface roughness is larger, or the thermal conductivity is larger than that of a portion other than the heat dissipating portion 41, or a portion against which cooling air from the outside is blown. A portion of the main face on which a metal material (such as a metal foil) or the like is disposed may be formed as the heat dissipating portion 41, or at least a portion of the main face may be machined to be a portion against which the air is more likely to be blown, or to be a portion which is more likely to come into contact with the air, in order to form the heat dissipating portion 41. Alternatively, in order to increase the surface area or the surface roughness, fine lines, protrusions and depressions, or the like may be formed in the main face to form the heat dissipating portion 41.

From the viewpoint of being able to be disposed in an optical path, the heat dissipating portion 41 described above preferably has a size and a shape that do not cause transmittance of light from the light source 2 to be reduced, such as a size and a shape that cause reflectance of the incident light to be reduced, for example. A region, of the sapphire itself, in which thermal conductivity has been improved, for example, by replacing some of the oxygen in the sapphire with nitrogen, may be formed as the heat dissipating portion 41. Examples of a nitride of aluminum obtained as a result of replacing some of the oxygen in the sapphire with nitrogen include aluminum nitride and aluminum oxynitride. Aluminum oxynitride is a compound or solid solution containing oxygen, nitrogen, and aluminum as constituent elements. Aluminum nitride and aluminum oxynitride can be used as the heat dissipating portion 41 since the thermal conductivity thereof is greater than that of aluminum oxide. Aluminum nitride and aluminum oxynitride may be crystalline or amorphous, and the higher the crystallinity, the higher the thermal conductivity. Furthermore, when a single crystal is used, since there is no crystalline interface, the transmittance of light is high, and it can thus be disposed on the optical path. When the heat dissipating portion 41 is formed from a material through which light is not easily transmitted, such as a metal, or formed in a shape through which light is not easily transmitted, the heat dissipating portion 41 is preferably disposed in a region that does not obstruct the optical path.

In the substrate 40, a functional portion is provided on the main face (the first main face 40a in FIG. 2) on which the heat dissipating portion 41 is provided. In the present specification, the "functional portion" means a function that controls or a portion that reinforces the intensity, color, phase, polarization, or direction of the incident light, a function that refracts the incident light, or the like. Specific examples of the functional portion include an optical filter that transmits or absorbs a part of the incident light, an anti-reflection film, a reflective film, a phosphor, and a color wheel. Only one type of such a functional portion may be provided, or two or more types of the functional portion may be provided. The functional portion may be further provided on the main face (the second main surface 40b in FIG. 2) on the opposite side from the main face on which the heat dissipating portion 41 is provided.

Examples of the optical filter include an optical filter that transmits or absorbs light in a specific wavelength range (an IR cutting film, or the like), and an optical filter that transmits or absorbs light in a specific polarization direction (liquid crystals, a polarizer, or the like). Furthermore, the reflective film also includes a dichroic film that transmits light having a specific wavelength and reflects light having other wavelengths.

In the optical component 4' according to the embodiment, the functional portion and the heat dissipating portion 41 are provided so that an angle formed between the c-axis of the sapphire and a line segment connecting the functional portion and the heat dissipating portion 41 is 15° or less. Specifically, it is sufficient for an angle formed between a direction in which heat is transferred from a part of the functional portion, in which the temperature is likely to become high, to the heat dissipating portion 41, and the c-axis of the sapphire to be 15° or less. For example, it is preferable that an angle formed between a line segment connecting, with the shortest distance, a central portion of the functional portion or a portion that is irradiated with light, and the heat dissipating portion 41, and the c-axis of the sapphire be 15° or less.

In the optical component 4' according to the embodiment, the heat dissipating portion 41 and the functional portion are preferably provided on the same main face. Then, the heat dissipating portion 41 and the functional portion are preferably disposed so as to be substantially parallel to the c-axis, that is, so that heat generated by the functional portion is released in a direction substantially parallel to the c-axis. Here, "substantially parallel" does not require that the direction from the functional portion toward the heat dissipating portion 41 be completely parallel to the c-axis, and includes such a case in which this direction and the c-axis intersect each other at an angle of 15° or less. In general, since the functional portion of the optical component 4' may generate or absorb heat, the functional portion is likely to become hot. When the heat dissipating portion 41 and the functional portion are provided on the same main face, heat is easily transferred along the main face of the substrate 40 that is substantially parallel to the c-axis, and easily dissipated through the heat dissipating portion 41.

When two or more types of the functional portion are provided on both main faces, the functional portion having the largest calorific value (which may also be referred to as a first functional portion) is preferably provided on the main face on which the heat dissipating portion 41 is provided (the first main face 40a in FIG. 2). When the main faces of the substrate 40 are substantially parallel to the c-axis, heat is easily transferred along the main faces of the substrate 40, and the heat of the first functional portion is easily dissipated through the heat dissipating portion 41.

The functional portion will be specifically described using, as an example, a case in which the optical component 4' according to the embodiment is the polarizing plate 4. As illustrated in FIGS. 4(A) and 4(B), the polarizing plate 4 includes the substrate 40, and the heat dissipating portion 41' and a polarizer 42 that are formed on the first main face 40a of the substrate 40. For example, the polarizer 42 has a structure in which a plurality of thin metal wires are aligned having gaps therebetween.

The thin metal wires are not particularly limited as long as they are formed from a metal, and examples of the metal include aluminum, copper, gold, silver, and alloys thereof. The thin metal wires are formed in the following manner, for example.

First, the first main face 40a of the substrate 40 is covered with a metal film using a film forming method such as a vapor deposition method or a sputtering method, for example. Next, a resist film is applied to the surface of the metal film, and exposed and developed to form a resist pattern. Next, etching processing is performed on the metal film using an etchant so that the metal film is etched in a striped pattern having a constant gap between the stripes. Next, by removing the resist pattern and performing cleaning, thin metal wires can be formed on the first main face 40a of the substrate 40.

Each of the thin metal wires has a thickness of from approximately 50 nm to approximately 500 nm, and has a width of from approximately 30 nm to approximately 150 nm. By setting the width of the gap between the thin metal wires to be shorter than the wavelength of transmitted light, the transmitted light can be converted to linearly polarized light, and a function as the polarizing plate 4 is realized. The width of the gap between the thin metal wires is normally from approximately 60 nm to approximately 300 nm.

Figure 4:
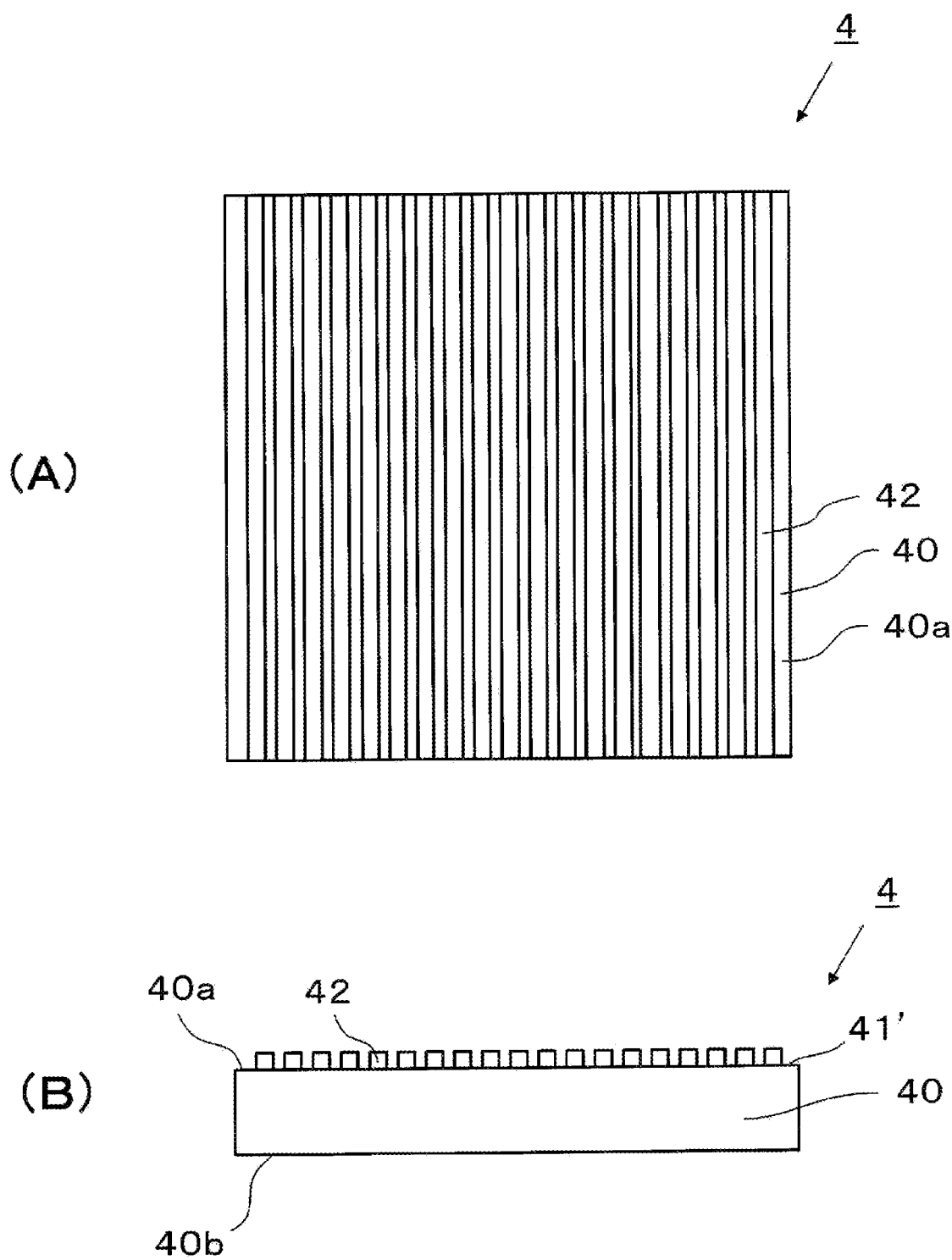

As with the optical component 4' (the polarizing plate 4) of an aspect illustrated in FIG. 4, when the first functional portion is provided on the first main face 40a, the heat dissipating portion 41 may also be formed on the first main face 40a (a first aspect). In this case, the surface roughness (an arithmetic mean roughness Ra, for example) of a portion or all of the first main face 40a may be larger than the surface roughness of the second main face 40b. By making the surface area of the first main face 40a relatively large, at least a portion of the first main face 40a can be formed as a heat dissipating portion 41' that is advantageous for heat dissipation to the outside. In this case, the heat dissipating portion 41' may be positioned on the optical path (including a central portion of the main face in a plan view). Even if the surface roughness is made slightly larger, no practical problem arises as long as the surface roughness is within a range that satisfies the optical characteristics (transmittance, for example) of the optical component 4'. Another aspect of the heat dissipating portion may be an aspect in which an opaque separate body such as a metal member is attached to the substrate 40 as the heat dissipating portion 41' (a second aspect). An example of this aspect is illustrated in FIG. 5.

Figure 5:
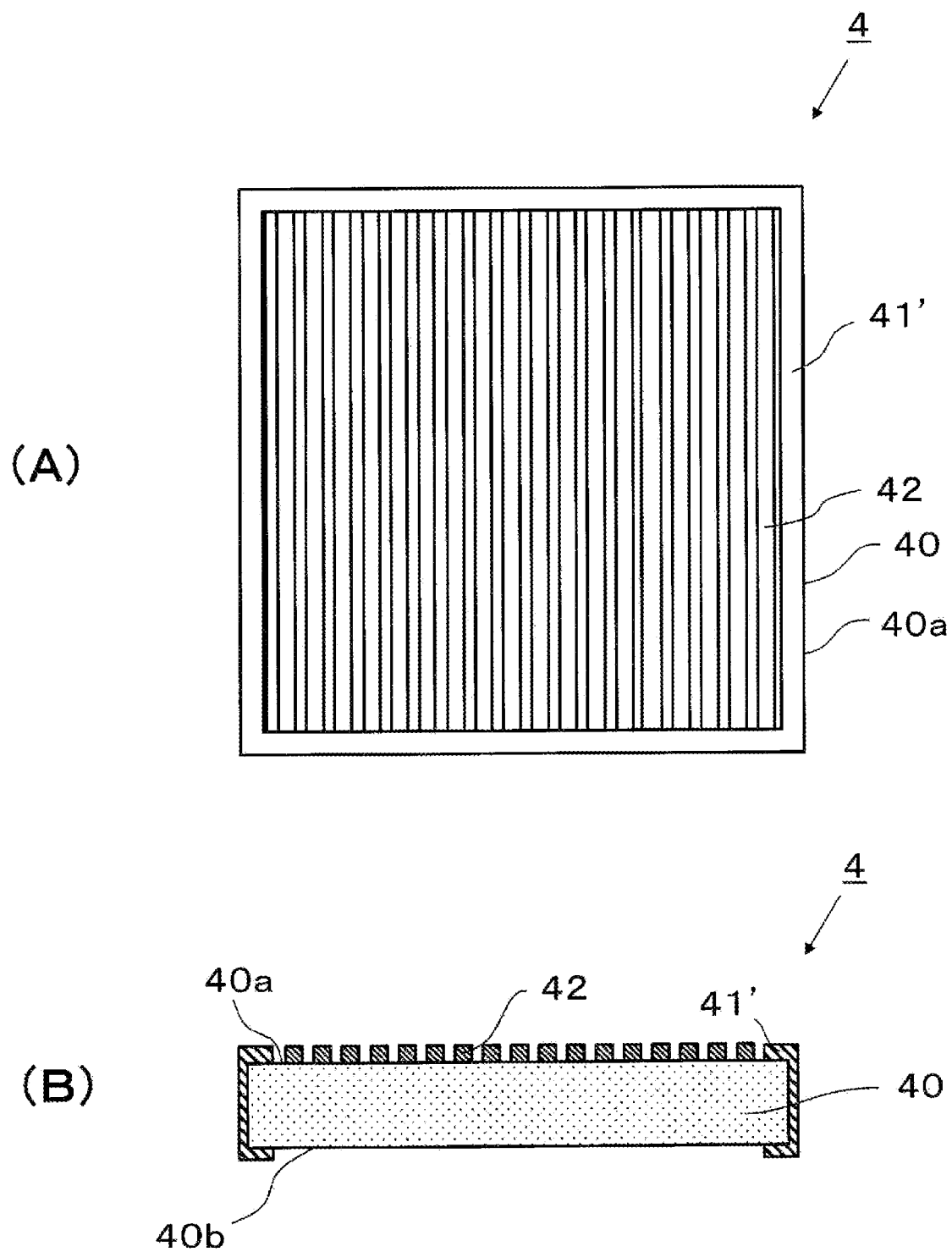

In the polarizing plate 4 illustrated in FIG. 5, a frame material (a casing) is attached to an outer peripheral portion of the substrate 40. In the polarizing plate 4 illustrated in FIG. 5, this frame acts as the heat dissipating portion 41', and the heat dissipating portion 41' is positioned outside the optical path. Heat generated by the functional portion positioned on the first main face 40a is efficiently dissipated to the outside along the main face of the substrate 40. This heat dissipation is further promoted by the heat dissipating portion 41'. In this case, for example, as illustrated in FIG. 5, the heat dissipating portion 41' may be in contact with a part extending from the outer peripheral portion of the first main face 40a to side surfaces of the substrate, and may further be in contact with the outer periphery of the second main face 40b.

The frame material may be attached so as to surround the entire outer peripheral portion of the substrate 40 as illustrated in FIG. 5, or may be attached to a portion of the outer peripheral portion of the substrate 40. When the frame material is attached to the portion of the outer peripheral portion of the substrate 40, a direction from a part of the main face of the substrate 40 located on the optical path toward the frame material is preferably substantially parallel to the c-axis of the sapphire in the substrate 40. Here, "substantially parallel" does not mean that the direction from the portion located on the optical path toward the frame material needs to be completely parallel to the c-axis, and includes such a case in which this direction and the c-axis intersect each other at an angle of 15° or less.

The optical component 4' according to the embodiment can also be used as the lens 5. When the optical component 4' is used as the lens 5, the substrate 40 may be machined to be a concave lens or a convex lens. When the optical component 4' is used as the lens 5, the heat dissipating portion 41 is provided outside the optical path of the main face (the first main face 40a, for example) so as not to obstruct the optical path.

Furthermore, the optical component 4' according to the embodiment can also be used as a wave plate. The wave plate is an optical component that uses birefringence (anisotropy of refractive index) to create a phase difference between light beams having different polarizations, and changes a polarization state.

The optical component 4' according to the embodiment is used, for example, as a member of the image display device 1 along with the light source 2. As described above, in the image display device (HUD device) 1 illustrated in FIG. 1, the image forming unit 3, the polarizing plate 4, and the lens 5 correspond to the optical component in the present specification. Further, when the emission window 7 includes an IR cutting film as the functional portion, the emission window 7 corresponds to the optical component. Then, at least one of these optical components (the polarizing plate 4, for example) is an optical component 4' according to the embodiment of the present disclosure. Hereinafter, the image display device 1 according to the embodiment of the present disclosure will be specifically described using a case, as an example, in which the image display device 1 is the HUD device 1 illustrated in FIG. 1. As described above, the HUD device 1 illustrated in FIG. 1 includes the light source 2, the image forming unit 3, the polarizing plate 4, the lens 5, the mirror 6, and the emission window 7. Two types of the polarizing plate 4, namely, an incidence-side polarizing plate 4a and an emission-side polarizing plate 4b are used.

In the HUD device 1 illustrated in FIG. 1, the incidence-side polarizing plate 4a, the image forming unit 3, the emission-side polarizing plate 4b, the lens 5, and the mirror 6 are arranged in this order from the side closer to the light source 2. In FIG. 1, an emission optical path L of image light including emitted light from the light source 2 is indicated by a dashed line arrow.

Of the polarizing plates 4, the incidence-side polarizing plate 4a is used to polarize light from the light source 2 and cause the light to enter the image forming unit 3. The heat dissipation of the incidence-side polarizing plate 4a can be further improved by forming the polarizer 42 from a material having a higher thermal conductivity than the sapphire (aluminum, copper, or the like, for example). Then, in particular, by forming the polarizer so that the longitudinal direction of a lattice is substantially parallel to the c-axis, the heat dissipation can be further improved. For example, a liquid crystal panel formed of twisted nematic liquid crystal (TN liquid crystal), or the like can be used as the image forming unit 3.

Of the polarizing plates 4, the emission-side polarizing plate 4b is used to block polarization, of the image light emitted from the image forming unit 3, in a direction that is not necessary for image display. The heat dissipation of the emission-side polarizing plate 4b can also be further improved by forming the polarizer 42 from a material having a higher thermal conductivity than that of the sapphire (aluminum, copper, or the like, for example). A combination of the polarization directions of the incidence-side polarizing plate 4a and the emission-side polarizing plate 4b is appropriately set in accordance with the type of the image forming unit 3. For example, when the TN liquid crystal is used as the image forming unit 3, the incidence-side polarizing plate 4a and the emission-side polarizing plate 4b are disposed with the polarization directions thereof rotated by 90° with respect to each other.

The image light transmitted through the emission-side polarizing plate 4b is incident on the lens 5. When the HUD device 1 is provided with the lens 5, the image light can be magnified. In order to magnify the image light, the lens 5 is a convex lens. The image light magnified by the lens 5 is reflected by the mirror 6 and projected onto a display unit (a screen) provided outside the HUD device 1, via the emission window 7. Examples of the display unit include a glass and a screen. When the HUD device 1 is used as the HUD device 1 for use in a vehicle, examples of the display unit include a windscreen, a rear glass, and a window of an automobile.

As described above, in the optical component 4' according to the embodiment, the inclination of the main faces is 75° or greater with respect to the c-plane of the sapphire, and the main faces are substantially parallel to the c-axis direction of the sapphire. The sapphire has a high thermal conductivity in a direction parallel to the c-axis, which is advantageous for heat transfer in a surface direction of the substrate. Furthermore, by providing the heat dissipating portion 41 on at least one of the main faces, heat dissipation can be efficiently performed in the surface direction of the substrate 40, which is the direction in which the thermal conductivity is high. Furthermore, by disposing the heat dissipating portion 41 and the functional portion so as to be substantially parallel to the c-axis, that is, so that heat generated by the functional portion is released in a direction substantially parallel to the c-axis, heat dissipation can be efficiently performed.

Since the optical component 4' has excellent heat dissipation, the image display device 1 provided with the optical component 4' according to the embodiment as one type of a member thereof can be used under conditions in which the temperature gets relatively high. Examples of the image display device 1 used under such high temperature conditions include the image display device 1 mounted on a moving body such as a vehicle, a train, a ship, an aircraft, and the like, and the image display device 1 used outdoors, and is the HUD device 1 for use in a vehicle, for example.

The optical component of the present disclosure is not limited to the optical component 4' according to the embodiment described above. The substrate 40 used in the optical component 4' according to the embodiment has a quadrangular shape. However, the shape of the substrate 40 used in the optical component of the present disclosure is set as appropriate, for example, in accordance with its application, or the like. Examples of the shape of each of the main faces when viewed in a plan view include polygonal shapes other than a quadrangular shape, such as a triangular shape, a pentagonal shape, and a hexagonal shape, a circular shape, and an elliptical shape.

Among these shapes, the shape of each of the main surfaces when viewed in a plan view is preferably a shape in which the outer peripheral portion of the main face is not equidistant from the center of the main face when the substrate is viewed in a plan view. Specifically, the shape is preferably a shape other than a circular shape, and is particularly preferably a rectangular shape. In this case, a direction in which a line segment that passes through the optical path on the main face (a central portion of the main face) and connects two parts of the outer peripheral portion is shortest is preferably substantially parallel to the c-axis of the sapphire in the substrate. Here, "substantially parallel" does not mean that this line segment needs to be completely parallel to the c-axis, and includes such a case in which an extended line of this line segment and the c-axis intersect each other at an angle of 15° or less. When the main face has a rectangular shape when the substrate is viewed in a plan view, this shortest line segment corresponds to a short side of the main face.

When the main face has a rectangular shape when the substrate is viewed in a plan view, the short sides of the main face are preferably substantially parallel to the c-axis of the sapphire. In this case, the heat dissipating portion is preferably disposed at least on a long side of the main face. When the short sides of the main face are substantially parallel to the c-axis of the sapphire, for example, even in such a case in which the heat dissipating portion is not provided on the entire periphery of the substrate due to reasons relating to design or the like, the heat transfer distance can be shortened, which is advantageous from the perspective of heat dissipation.

With respect to the optical component 4' according to the embodiment, a case has been described as an example in which the functional portion is the polarizer 42. However, the functional portion is not limited to the polarizer 42. The functional portion may be set as appropriate in accordance with the application of the optical component, and may be an optical filter, an anti-reflection film, a reflective film, a phosphor, or the like, other than the polarizer 42.

Furthermore, the image display device 1 according to the present disclosure is not limited to the HUD device 1 illustrated in FIG. 1. The image display device 1 according to the present disclosure may be provided with an air blowing unit capable of blowing air against the optical component, in order to cool the optical component used as a member. Specifically, in the optical component of the present disclosure, an air blowing unit may be provided that is capable of blowing air against the main face on which the heat dissipating portion 41 is provided, in the c-axis direction of the sapphire. Furthermore, the heat dissipating portion 41 may be formed to extend substantially parallel to the c-axis of the sapphire. In this case, the air blowing unit that blows air in a direction substantially parallel to the c-axis of the sapphire may be provided.

Examples of the air blowing unit include a sirocco fan, and a propeller fan. Of these, the sirocco fan has a strong air feeding force, and in addition, has an air blowing direction that is different from the rotation axis direction of the fan. Thus, the degree of freedom of the installation location also increases, and thus the sirocco fan may be used.

The image display device according to the present disclosure is not limited to the image display device 1 described above. For example, the light passing through the optical path is not limited to two-dimensional light, and may be a laser beam or the like. Examples of the optical component in this case include a laser light fluorescent plate, and a color wheel. In this aspect, since an incidence area of the laser beam is relatively small (a range of the optical path is relatively narrow with respect to the area of the substrate in a plan view), the degree of freedom of design, such as the position and shape of the heat dissipating portion 41, is easily improved.

REFERENCE SIGNS LIST

1 Image display device (HUD device)
2 Light source
3 Image forming unit
4 Polarizing plate
4' Optical component
4a Incidence-side polarizing plate
4b Emission-side polarizing plate
40 Substrate
40a First main face
40b Second main face
41, 41' Heat dissipating portion
42 Polarizer

The invention claimed is:

1. An optical component, comprising:
a substrate containing sapphire, wherein the substrate is provided with a functional portion and a heat dissipating portion,
an inclination of a main face of the substrate is 75° or greater with respect to a c-plane of the sapphire, and
the functional portion and the heat dissipating portion are provided so that an angle formed by a c-axis of the sapphire and a line segment connecting the functional portion and the heat dissipating portion is 15° or less.

2. The optical component according to claim 1, wherein the functional portion and the heat dissipating portion are provided at the same main face.

3. The optical component according to claim 2, wherein the functional portion is at least one type selected from the group consisting of an optical filter that transmits or absorbs a part of incident light, an anti-reflection film, a reflective film, and a phosphor.

4. The optical component according to claim 2, wherein a plurality of the functional portions respectively having different functions are provided, and a first functional portion having a largest calorific value among the plurality of functional portions is provided at the main face at which the heat dissipating portion is provided.

5. The optical component according to claim 1, wherein the heat dissipating portion is formed of a material having a thermal conductivity greater than a thermal conductivity of the sapphire, and is provided to extend in a direction parallel to the c-axis of the sapphire.

6. The optical component according to claim 1, wherein the optical component is a lens or a wave plate through which light is transmitted, and
the heat dissipating portion is provided outside an optical path on the main face.

7. The optical component according to claim 1, wherein the heat dissipating portion contains a nitride of aluminum.

8. An image display device comprising:
a light source; and
the optical component according to claim 1 positioned on an optical path of light emitted from the light source.

9. The image display device according to claim 8, wherein a frame material is further attached to at least a portion of an outer peripheral portion of the substrate.

10. The image display device according to claim 8, wherein
the main face has a shape other than a circular shape, and
a direction in which a line segment passing through the optical path on the main face and connecting two parts of the outer peripheral portion of the substrate is shortest is substantially parallel to the c-axis of the sapphire in the substrate.

11. The image display device according to claim 10, wherein
the main face has a rectangular shape, and
a short side direction of the main face is substantially parallel to the c-axis of the sapphire in the substrate.

12. The image display device according to claim 9, wherein
the frame material is attached to a portion of the outer peripheral portion of the substrate, and
a direction from a part of the main face located on the optical path toward the frame material is substantially parallel to the c-axis of the sapphire in the substrate.

13. The image display device according to claim 9, further comprising:
an air blowing unit capable of blowing air against the main face in a direction of the c-axis of the sapphire.

14. The image display device according to claim 13, wherein
the air blowing unit is a sirocco fan.

15. A head-up display comprising:
the image display device according to claim 9; and
a display unit on which an image is displayed.

* * * * *